(12) United States Patent
Ng

(10) Patent No.: US 9,571,075 B1
(45) Date of Patent: Feb. 14, 2017

(54) INPUT VOLTAGE CLAMP WITH SIGNAL SPLITTING AND CROSS-OVER CAPABILITIES

(71) Applicant: Altera Corporation, San Jose, CA (US)

(72) Inventor: Hoong Chin Ng, Sungai Petani (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/624,234

(22) Filed: Feb. 17, 2015

(51) Int. Cl.
*H03K 5/08* (2006.01)
*H03K 3/012* (2006.01)
*H03K 3/01* (2006.01)

(52) U.S. Cl.
CPC ........ *H03K 5/08* (2013.01); *H03K 3/01* (2013.01); *H03K 3/012* (2013.01)

(58) Field of Classification Search
CPC .......... H03K 3/01; H03K 3/012; H03K 17/56; H03K 17/168; H03K 17/0822; H03K 17/0828; H03K 19/20; H03K 19/195
USPC ............................ 327/321, 328, 330; 326/80
See application file for complete search history.

(56) References Cited

U.S. PATENT DOCUMENTS

| | | | |
|---|---|---|---|
| 5,280,200 A | 1/1994 | Tarng | |
| 5,528,172 A | 6/1996 | Sundstrom | |
| 5,818,194 A | 10/1998 | Nordby | |
| 6,049,227 A | 4/2000 | Goetting et al. | |
| 8,841,890 B2 | 9/2014 | Ochoa et al. | |
| 2010/0164593 A1* | 7/2010 | Ha | H03K 19/018528 327/333 |
| 2013/0169362 A1 | 7/2013 | Yang et al. | |
| 2013/0207687 A1* | 8/2013 | Honda | H03K 19/018521 326/30 |

* cited by examiner

*Primary Examiner* — John Poos
(74) *Attorney, Agent, or Firm* — Treyz Law Group, P.C.; Jason Tsai

(57) ABSTRACT

An integrated circuit with input voltage clamping circuitry for receiving an input signal from external devices is provided. The input voltage clamping circuitry may include a voltage splitting and clamping circuit, a selectively enabled transmission gate circuit, and a digitization and clamping circuit. The voltage splitting and clamping circuit may be configured to split the input signal into at least two separate components each of which is limited to a predetermined voltage swing. The transmission gate circuit may be selectively enabled to provide full rail signaling when the input signal has a power supply level that is below a predefined threshold. The digitization and clamping circuit may include a Schmitt trigger translation for converting the split signal components to a digitized signal that is clamped down to the predefined threshold.

19 Claims, 8 Drawing Sheets

INPUT VOLTAGE CLAMP WITH SIGNAL SPLITTING AND CROSS-OVER CAPABILITIES

BACKGROUND

This invention relates to integrated circuits, and more particularly, to integrated circuits with input voltage clamping circuits.

As integrated circuits scale towards smaller technology nodes (i.e., 20 nanometers and beyond), the maximum nominal voltage that can be handled by thick gate input/output (IO) transistors becomes smaller. For example, the nominal power supply voltage that is used to power a thick gate IO transistor might be limited to 1.8 V. However, input signals that are received at the IO pads can exhibit voltage swings of up to 3 V or more to allow for backward compatibility with legacy interface protocols. These input signals are typically received at an input voltage clamp that is configured to shift down the high voltage level at the IO pad down to the lower nominal voltage.

A conventional input voltage clamp consists of a single n-channel metal-oxide-semiconductor (NMOS) pass gate transistor. The NMOS transistor has a drain terminal that receives the input signal from the IO pad, a source terminal that is connected to a corresponding receiver in the integrated circuit, and a gate terminal that is biased to the nominal voltage level. Connected in this way, the input signal will have its voltage swing clipped down from the higher IO voltage level to less than the lower nominal voltage level.

Such types of conventional voltage clamp often suffer from loss of a substantial portion of the input signal when passing through the NMOS pass gate. The input signal is an analog signal having a slew rate that is critical to determining the duty cycle of the receiver output. In scenarios where a 3.3 V IO signal is shifted down to a 1.8 V, 1.5 V, or 1.1 V receiver input voltage level, up to two-thirds or more of the input signal can be lost, which can severely impact performance of the receiver subsystem.

SUMMARY

An integrated circuit that includes input voltage clamping circuitry is provided. The integrated circuit may receive an input signal at an input pad from external circuitry. The input voltage clamping circuitry may include at least a voltage splitting and clamping circuit, a transmission gate circuit, and/or a digitization and clamping circuit.

The voltage splitting and clamping circuit may be configured to split the input signal into corresponding first and second parallel output signals each of which exhibits the same predetermined amount of voltage swing. In particular, the voltage splitting and clamping circuit may include a p-channel pass gate clamp that is turned off in response to the first output signal falling below a first predetermined threshold, an n-channel pass gate clamp that is turned off in response to the second output signal rising above a second predetermined threshold that is different than the first predetermined threshold. The voltage splitting and clamping circuit may also include a p-channel voltage keeper that ensures that the first output signal is maintained above a third predetermined threshold that is substantially similar to the first predetermined threshold and an n-channel voltage keeper that ensures that the second output signal is maintained below a fourth predetermined threshold that is substantially similar to the second predetermined threshold.

The p-channel pass gate clamp and the p-channel voltage keeper may be powered using a first bias voltage, whereas the n-channel pass gate clamp and the n-channel voltage keeper is powered using a second bias voltage that is different than the first bias voltage.

The transmission gate circuit may include pass gate clamps and voltage keepers that are selectively enabled when the input signal has a voltage swing that is less than or equal to the second bias voltage. The activation of the transmission gate circuit ensures rail-to-rail signaling for the first and second parallel output signals.

The digitization and clamping circuit may include a Schmitt trigger comparator having transistors coupled in a positive feedback configuration and an n-channel pass gate that is powered using the second bias voltage. The digitization and clamping circuit may receive the first and second parallel output signals from the voltage splitting and clamping circuit and output a corresponding digitized output signal that is clamped down to a desired nominal thick gate oxide transistor voltage level.

Further features of the invention, its nature and various advantages, will be more apparent from the accompanying drawings and the following detailed description of the preferred embodiments.

DETAILED DESCRIPTION

The present invention relates to integrated circuits and more specifically to integrated circuits with input clamping circuitry.

An integrated circuit typically receives external signals via input/output (IO) pads. These IO signals can exhibit a wide voltage range depending on the communications protocol that is currently being supported by the integrated circuit. For example, the input signal can exhibit a relatively small voltage swing of 1.5 V when supporting newer interface standards or may exhibit a relatively large voltage swing of 3.3 V when supporting older legacy interface standards. In scenarios in which the input signals exhibit large voltage swings, input clamping circuitry may be used to shift down the high voltage at the IO pad to a reduced nominal voltage level before being received at a corresponding receiver.

Figure 1:
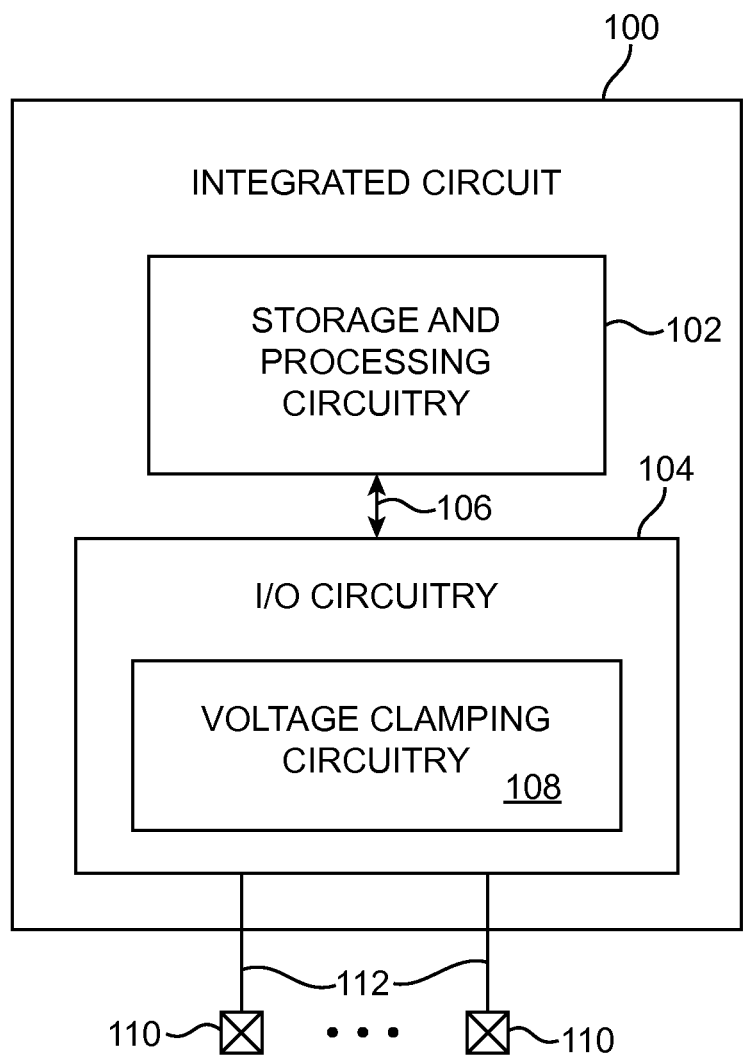
FIG. 1 is a diagram of an illustrative integrated circuit in accordance with an embodiment.

Conventional input voltage clamps clip away a large portion of the input signal. In accordance with an embodiment of the present invention, improved input voltage clamping circuitry is provided that retains more of the input signal. An illustrative embodiment of an integrated circuit 100 in accordance with the present invention is shown in FIG. 1.

Integrated circuit 100 may have multiple components. These components may include storage and processing circuitry 102 and input/output (IO) circuitry 104. Storage and processing circuitry 102 may include embedded microprocessors, digital signal processors (DSP), arithmetic circuitry, logic circuitry, microcontrollers, or other processing circuitry. The storage and processing circuitry 102 may further have random-access memory (RAM), first-in first-out (FIFO) circuitry, stack or last-in first-out (LIFO) circuitry, read-only memory (ROM), or other memory elements.

Internal interconnection resources 106 such as conductive lines and busses may be used to send data from one component to another component or to broadcast data from one component to one or more other components. External interconnection resources 112 such as conductive lines and busses, optical interconnect infrastructure, or wired and wireless networks with optional intermediate switches may be used to communicate with other devices.

Input-output circuitry 104 may be formed along one or more edges of integrated circuit 100. Circuitry 104 may be used for driving signals off of device 100 and for receiving signals from other external devices via IO pins 110. Each pin 110 may, for example, be connected to a power supply line, a data line, a control line, or other signal conductor on a printed circuit board. Integrated circuit 100 may have any suitable number of IO pins 110 (which are sometimes referred to as input-output pads or input-output terminals).

Storage and processing circuitry 102 (sometimes referred to as core logic circuitry) may be powered using a relatively lower core power supply voltage Vcc compared to an elevated power supply voltage Vnom that is used to bias IO circuitry 104. As a result, the peripheral IO circuitry 104 may include transistor structures which thick gate oxide layers (e.g., gate oxide layers with thicknesses of about 15-30 angstroms), whereas the inner core circuitry 102 may include transistor structures formed using relatively thinner gate oxides (e.g., gate oxide layers with thicknesses of about 5-14 angstroms).

The use of the larger power supply voltage ensures that input and output drivers in IO circuitry 102 are able to communicate properly with external circuitry. As an example, the elevated power supply voltage allows output drivers to transmit outgoing data signals at voltage levels that are compliant with commonly used communications standards. These standards may require the use of relatively large signal voltages to increase noise immunity on circuit board busses. If only lower voltages such as Vcc were available to power the input-output drivers, it might be difficult or impossible to interface with other integrated circuits.

For example, parts of core logic 102 that include thin gate oxide transistor structures may be biased using core power supply voltages of 1.0 V or less while parts of the IO circuitry 104 that include thick gate oxide transistor structures may be biased using a higher power supply voltage of 1.1 V or more (e.g., 1.2 V, 1.5 V or more, 1.8 V or more, etc.). In particular, circuitry 104 may also include input drivers for receiving incoming data signals at voltage levels that are compliant with one or more IO interface protocols. These input drivers (sometimes referred to herein as receivers) may be implemented using thick gate oxide transistors and may (as an example) be biased using a nominal voltage Vnom of 1.8 V.

For certain interface standards (i.e., especially older legacy interface protocols), input signals arriving at IO pins 110 can sometimes be driven to an IO power supply voltage level Vccio of 2.5 V or more. To accommodate situations where the input signal has a positive voltage level Vccio that is greater than the nominal receiver voltage Vnom, IO circuitry 104 may be provided with voltage clamping circuitry such as input voltage clamping circuitry 108 that is configured to shift the positive power supply voltage level of the arriving input signal from Vccio to Vnom.

As described above in the Background section, conventional input voltage clamping circuits implemented using only a single NMOS pass gate clip away a large portion of the input signal, and as a result, the input signal is especially susceptible to duty cycle distortion and any threshold voltage offset that is present in the NMOS pass gates or the corresponding receivers. It would therefore be desirable to be able to provide an improved clamping circuit that retains more of the input signal while shifting down the input swing from Vccio to Vnom.

Figure 2:
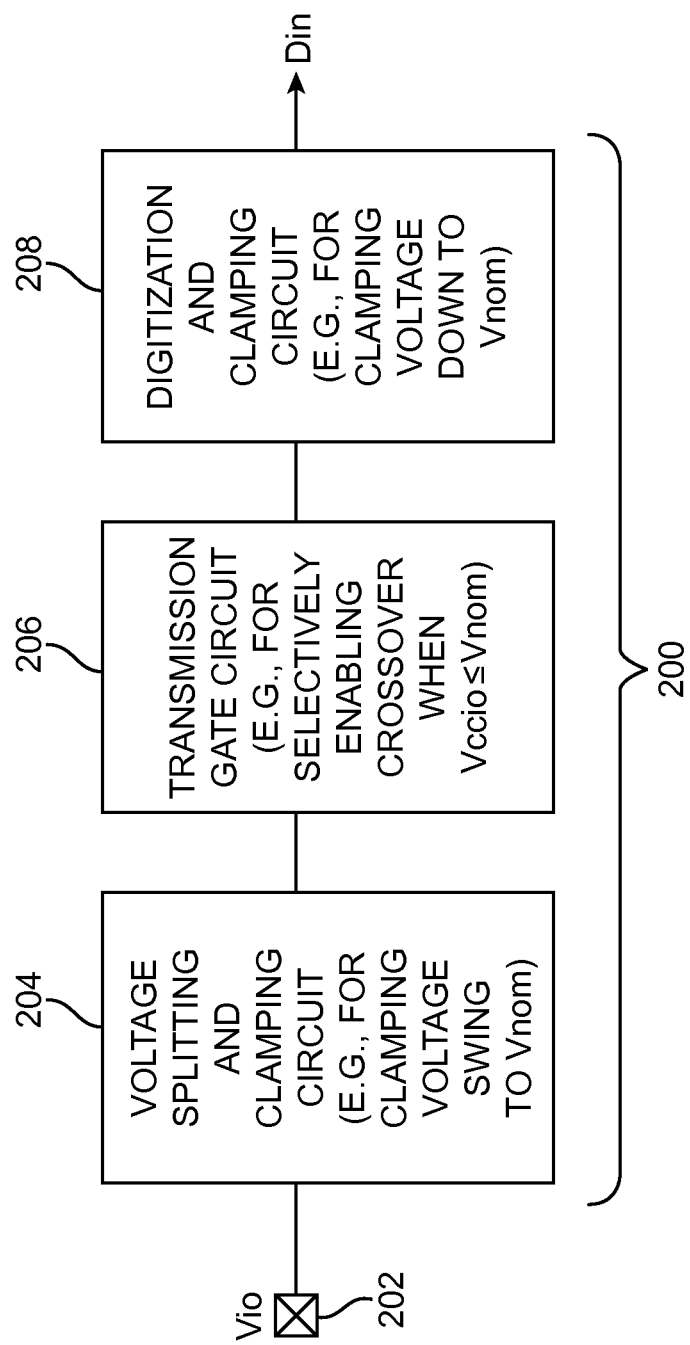
FIG. 2 is a diagram of illustrative input voltage clamping circuitry that includes a voltage splitting and clamping circuit, a selectively enabled cross-over circuit, and a digitization and clamping circuit in accordance with an embodiment.

In accordance with an embodiment, FIG. 2 shows voltage clamping circuitry 200 (which may be used as circuitry 108 of FIG. 1) that reduces its susceptibility to duty cycle distortion by retaining a larger portion of the input signal. As shown in FIG. 2, input voltage clamping circuitry 200 may include a voltage splitting and clamping circuit 204, a transmission gate circuit 206, and a digitization and clamping circuit 208. Circuit 204 may serve to split the input signal from the IO pad into at least two signals each of which has a voltage swing that is limited to the nominal voltage Vnom of the thick gate oxide transistor. Any internal voltage that is higher than Vnom may risk damaging associated thick gate oxide transistor structures.

Circuit 206 may be selectively enabled as a transmission gate (e.g., to enable "cross-over" between the two split signals) when the voltage swing of the input signal is actually within Vnom (i.e., when Vccio is less than Vnom). When cross-over is enabled, circuit 206 may help to ensure that the two split signals are capable of swinging full rail between ground voltage Vss and nominal voltage Vnom. Circuit 208 may serve to convert the two split signals into a single-ended signal, digitize the converted single-ended signal, and finally clamp the digitized signal down to Vnom. The final digitized output that is shifted down to Vnom is shown as Din in FIG. 2. Exemplary circuit implementations of each of these circuits and their corresponding modes of operation are described in the following figures.

Figure 3:
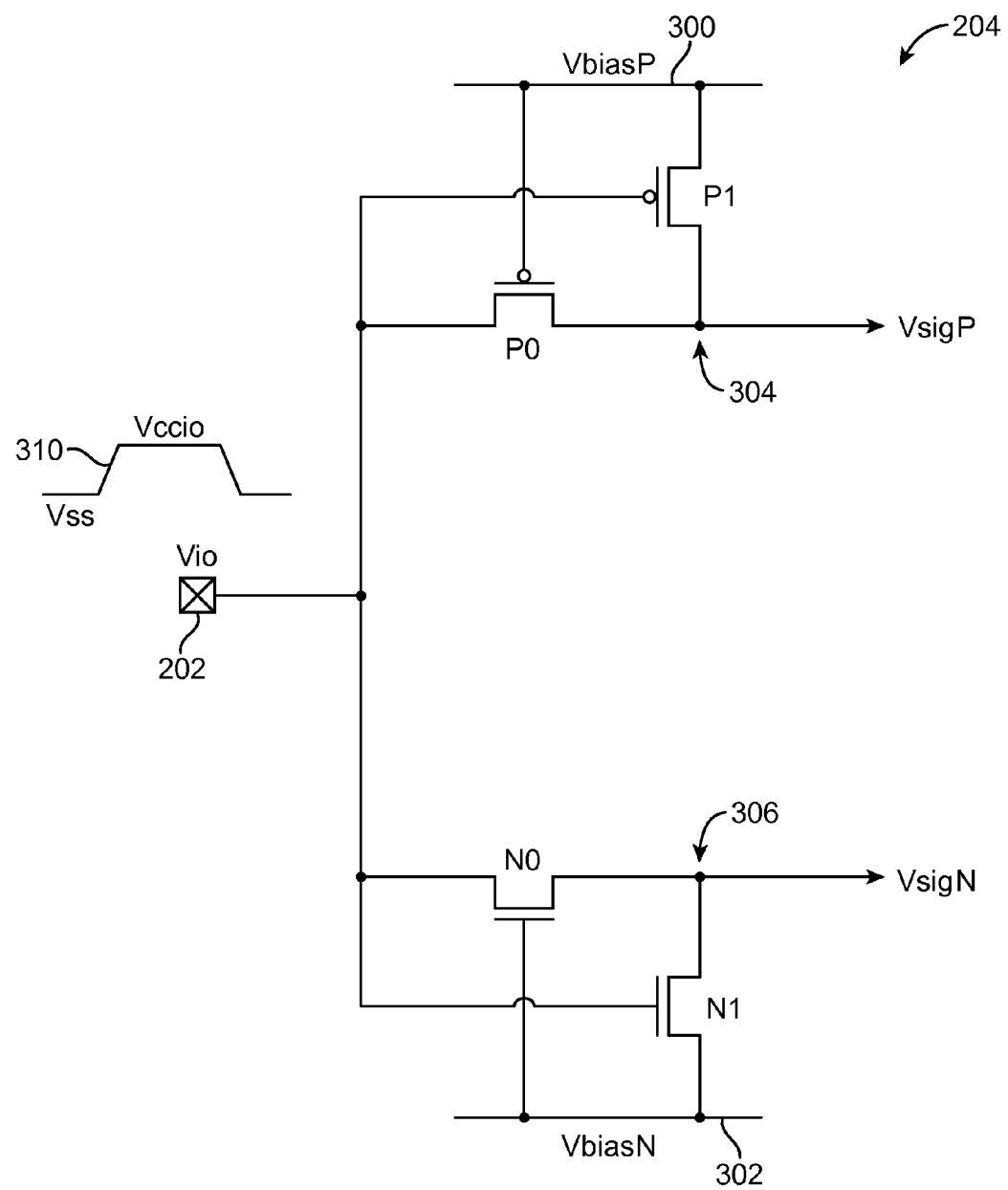
FIG. 3 is a circuit diagram of an illustrative voltage splitting and clamping circuit of the type shown in FIG. 2 in accordance with an embodiment.

FIG. 3 is a circuit diagram of an illustrative voltage splitting and clamping circuit of the type shown in FIG. 2 in accordance with an embodiment. As shown in FIG. 3, voltage splitting and clamping circuit 204 may have an input that receives an input signal Vio from IO pad 202, a first output node 304 on which a first split signal VsigP is generated, a second output node 306 on which a second split signal VsigN is generated, a first p-channel transistor P0, a second p-channel transistor P1, a first re-channel transistor N0, and a second n-channel transistor N1. VsigP and VsigN may sometimes be referred to as "parallel" output signals.

In particular, first p-channel transistor P0 may have a first source-drain terminal that is coupled to the input of circuit 204 (i.e., to IO pin 202), a second source-drain terminal that is coupled to the first output 304 of circuit 204, and a gate terminal that is coupled to a first voltage biasing line 300 (e.g., a positive voltage supply line on which bias voltage VbiasP is provided). The second p-channel transistor P1 may have a first source-drain terminal that is coupled to first voltage biasing line 300, a second source-drain terminal that is coupled to the first output of circuit 204, and a gate terminal that is coupled to the input of circuit 204.

Similarly, first n-channel transistor N0 may have a first source-drain terminal that is coupled to the input of circuit 204, a second source-drain terminal that is coupled to the second output 306 of circuit 204, and a gate terminal that is coupled to a second voltage biasing line 302 (e.g., a positive voltage supply line on which bias voltage VbiasN is provided). The second n-channel transistor N1 may have a first source-drain terminal that is coupled to second voltage biasing line 302, a second source-drain terminal that is coupled to the second output of circuit 204, and a gate terminal that is coupled to the input of circuit 204.

Circuit 204 may receive an input IO signal Vio (e.g., an arriving waveform 310 that swings between ground voltage Vss and positive IO power supply voltage Vccio) and may split input signal Vio into two corresponding signals VsigP and VsigN. Voltage VbiasP may be set equal to Vccio minus Vnom, whereas VbiasN may be set equal to Vss plus Vnom (or simply Vnom if Vss is equal to zero volts). VbiasP may, for example, be derived from Vccio using a voltage divider or a stacked diode.

Arranged in the configuration of FIG. 3, transistor P0 may serve as a PMOS pass gate clamping transistor that is turned off as soon as VsigP falls below (VbiasP+Vtp), where Vtp is equal to the threshold voltage of p-channel transistor P0, and is turned on for all higher VsigP levels. Transistor P1 may serve as a pull-up voltage keeper for ensuring that the minimum voltage of VsigP is equal to VbiasP. Transistor P1 may maintain VsigP at VbiasP whenever Vio at the IO pad is below (VbiasP−Vtp) while also supplying a leakage current path for transistor P0.

Transistor N0 may serve as an NMOS pass gate clamping transistor that is turned off as soon as VsigN rises above (VbiasN+Vtn), where Vtn is equal to the threshold voltage of n-channel transistor N0, and is turned on for all lower VsigN levels. Transistor N1 may serve as a pull-down voltage keeper for ensuring that the maximum voltage of VsigN is equal to VbiasN. Transistor N1 may maintain VsigN at VbiasN whenever Vio at the IO pad is above (VbiasN+Vtn) while also supplying a leakage current path for transistor N0.

Figure 4A:
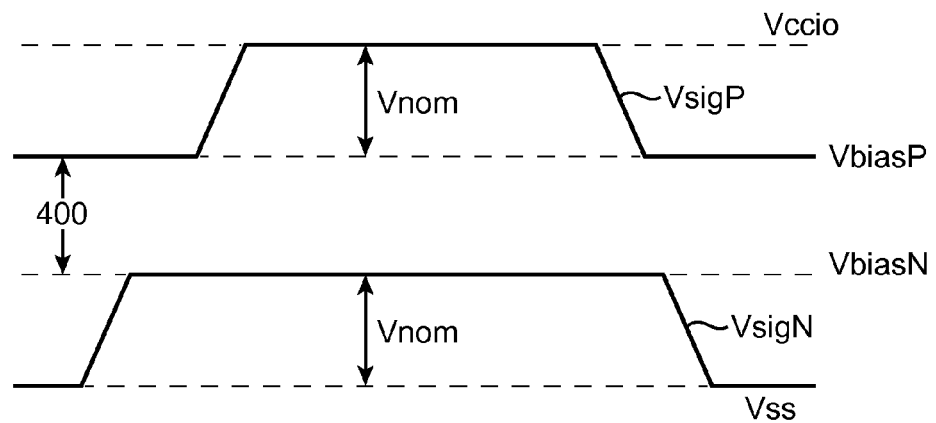
FIGS. 4A and 4B show waveforms that illustrate the operation of the voltage splitting and clamping circuit of FIG. 3 in accordance with an embodiment.

Connected in this way, the voltage level of VsigP is constrained between VbiasP and Vccio, whereas the voltage level of VsigN is constrained between Vss and VbiasN. FIG. 4A shows illustrative waveforms for VsigP and VsigN for Vccio levels greater than 2*Vnom. As shown in FIG. 4A, VsigP is allowed to have a negative Vnom voltage swing from Vccio (e.g., between Vccio and VbiasP), whereas VsigN is allowed to have a positive Vnom voltage signal from Vss (e.g., between Vss and Vnom). Because a voltage gap 400 is still present between VsigP and VsigN (i.e., because VsigP and VsigN are non-overlapping), at least a small portion of the input signal is lost during the splitting process.

Figure 4B:
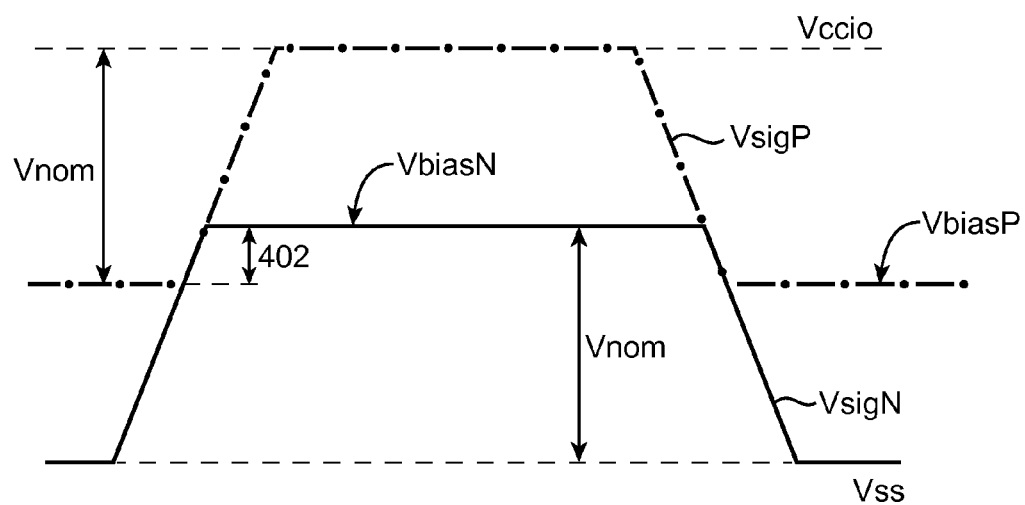

In other embodiments where Vccio is less than 2*Vnom, VsigP will overlap with VsigN to deliver the complete signal information to the corresponding receiver circuit (see, waveforms of FIG. 4B). As shown in FIG. 4B, VbiasP will actually be lower than VbiasN, and as a result, VsigP will swing lower than VbiasN and VsigN will swing higher than VbiasP to yield an overlapping region 402. For yet even smaller Vccio levels where Vccio is less than Vnom, VbiasP may simply be set equal to Vss (e.g., imagine the upper bound and lower bound of FIG. 4B collapsing so that VsigP coincides with VsigN).

As shown in either the scenario of FIG. 4A or FIG. 4B, the use of circuit 204 in splitting the input signal into at least two signals VsigP and VsigN each having a more manageable thick gate IO voltage swing of Vnom, a substantially larger portion of the input signal is kept intact. Preserving a larger portion of input signal Vio in this way can help better manage and mitigate duty cycle distortion and threshold voltage offset, thereby helping to improve overall circuit performance.

Figure 5:
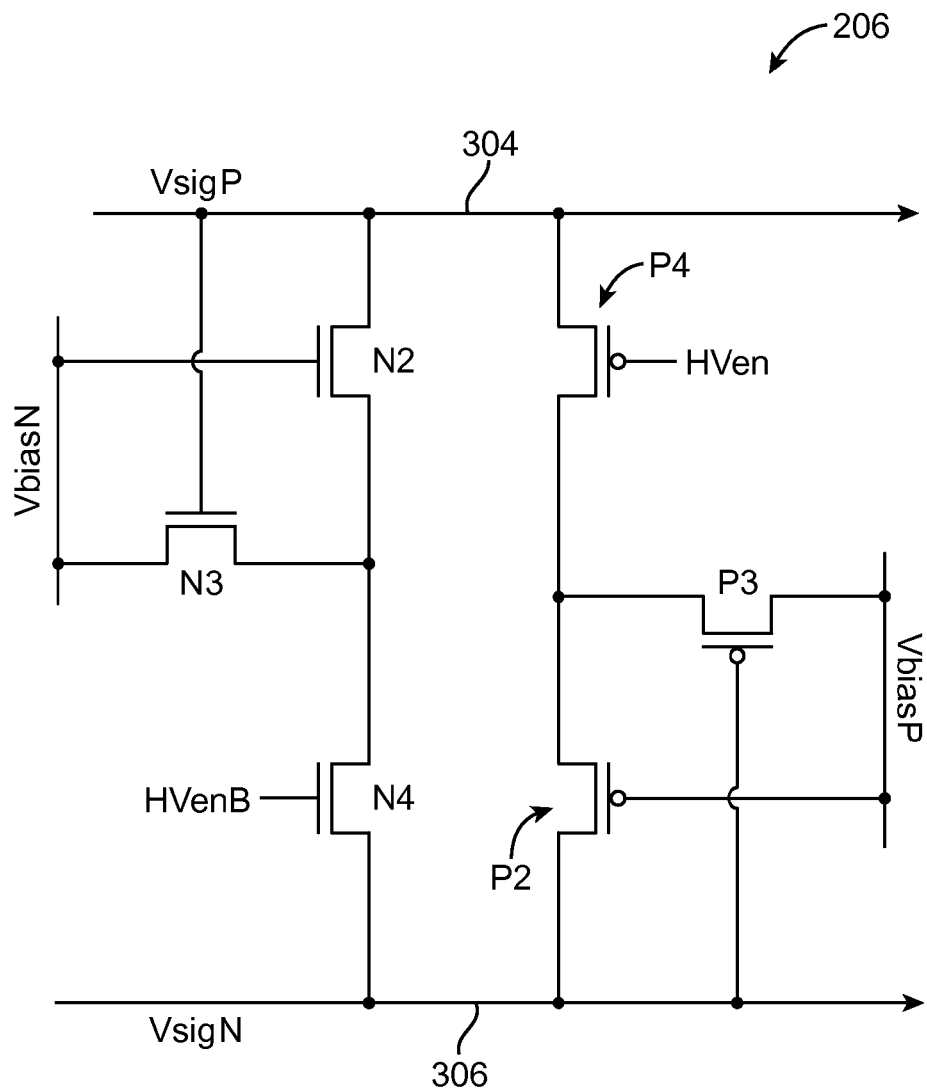
FIG. 5 is a circuit diagram of an illustrative cross-over circuit of the type shown in FIG. 2 in accordance with an embodiment.

FIG. 5 is a circuit diagram of transmission gate circuit 206. As shown in FIG. 5, circuit 206 may include n-channel transistors N2, N3, and N4 and p-channel transistor P2, P3, and P4. In particular, transistor N2 may have a first source-drain terminal that is coupled to node 304 (i.e., the node on which VsigP is provided), a gate terminal that receives VbiasN, and a second source-drain terminal. Transistor N3 may have a first source-drain terminal that receives VbiasN, a gate terminal that is coupled to node 304, and a second source-drain terminal that is coupled to the second source-drain terminal of transistor N2. Transistor N4 may have a first source-drain terminal that is coupled to the second source-drain terminal of transistor N2, a second source-drain terminal that is coupled to node 306 (i.e., the node on which VsigN is provided), and a gate terminal that receives complementary enable signal HVenB.

Referring now to the p-channel transistors, transistor P2 may have a first source-drain terminal that is coupled to node 306, a gate terminal that receives VbiasP, and a second source-drain terminal. Transistor P3 may have a first source-drain terminal that receives VbiasP, a gate terminal that is coupled to node 306, and a second source-drain terminal that is coupled to the second source-drain terminal of transistor P2. Transistor P4 may have a first source-drain terminal that is coupled to the second source-drain terminal of transistor P2, a second source-drain terminal that is coupled to node 304, and a gate terminal that receives true enable signal HVen. True and complementary enable signals HVen and HVenB may either be logic "1" and "0", or logic "0" and "1", respectively.

Transistor P2 acts like a pass gate clamp and has similar function as transistor P0 (FIG. 3) while transistor P3 acts like a voltage keeper and has similar function as transistor P1. Similarly, transistor N2 acts like a pass gate clamp and has similar function as transistor N0, whereas transistor N3 acts like a voltage keeper and has similar function as transistor N1 while crossover is enabled.

Configured in this way, circuit 206 can be selectively enabled as a bidirectional "crossover" transmission gate whenever the input signal is within the nominal voltage level (e.g., when Vccio is less than or equal to Vnom). When Vccio is greater than Vccio, the enable signals may be deasserted to deactivate circuit 206 (e.g., by driving HVen high to turn off transistor P4 and by driving HVenB low to turn off transistor N4).

When Vccio is less than or equal to Vnom, the enable signals may be asserted to enable crossover (e.g., by driving HVen low to turn on transistor P4 and by driving HVenB high to turn on transistor N4). Enabling crossover (which effectively configures circuits 204 and 206 as active bidirectional transmission gates) ensures rail-to-rail signaling between Vss and Vccio when the input signal Vio has a positive voltage level Vccio that is within Vnom. Configured in this way, any signal degradation due to the addition of input clamps becomes negligible when the input signal is within Vnom.

Figure 6A:
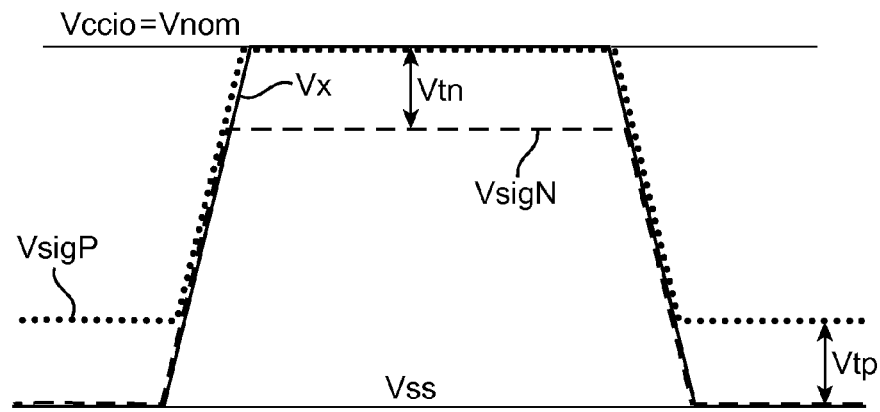
FIGS. 6A and 6B show waveforms that illustrate the operation of the cross-over circuit of FIG. 5 in accordance with an embodiment.
Figure 6B:
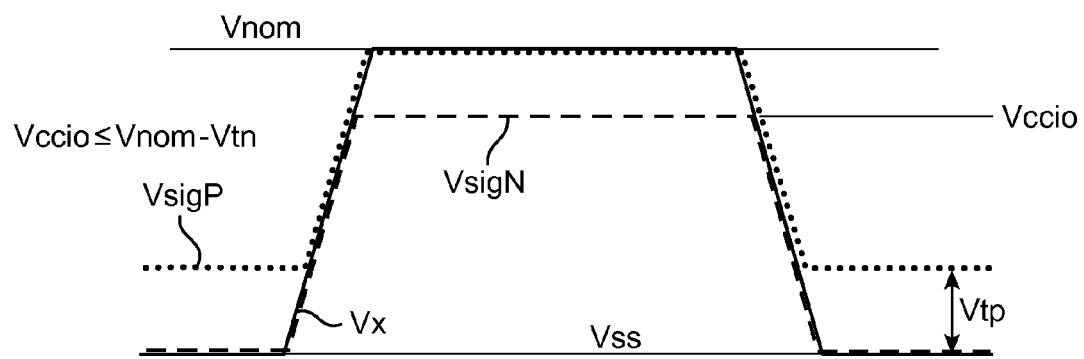

The result of enabling crossover is shown in the timing diagrams of FIGS. 6A and 6B. When Vccio is greater than Vnom, the VsigP and VsigN waveforms will be unaffected by circuit 206 since circuit 206 will be deactivated (e.g., HVen and HVenB will be deasserted to turn off transistors P4 and N4, respectively). FIG. 6A shows results of the waveforms when Vccio is equal to Vnom. In such scenarios, VsigP will only pull down to one Vtp above Vss, and VsigN will pull up to one Vtn below Vnom. However, when circuit 206 is activated in the bidirectional crossover mode, both VsigP and VsigN can be driven all the way up to Vnom and all the way down to Vss to enable full rail signaling (see, e.g., waveform Vx).

FIG. 6B shows results of the waveforms when Vccio is less than Vnom-Vtn. In such scenarios, VsigP will only pull down to one Vtp above Vss, whereas VsigN is able to swing all the way up to Vccio (assuming Vccio is less than one Vtn below Vnom). However, when circuit 206 is activated in the bidirectional crossover mode, both VsigP and VsigN can be driven all the way up to Vccio and all the way down to Vss to enable full rail signaling (see, e.g., waveform Vx in FIG. 6B). The use of circuit 206 therefore serves to make the input voltage clamping (which can introduce some undesired voltage drop due to the threshold voltages Vtn and Vtp of the clamping transistors, as shown in FIGS. 6A and 6B) transparent to the input receiver/buffer whenever Vccio is less than or equal to Vnom.

Figure 7:
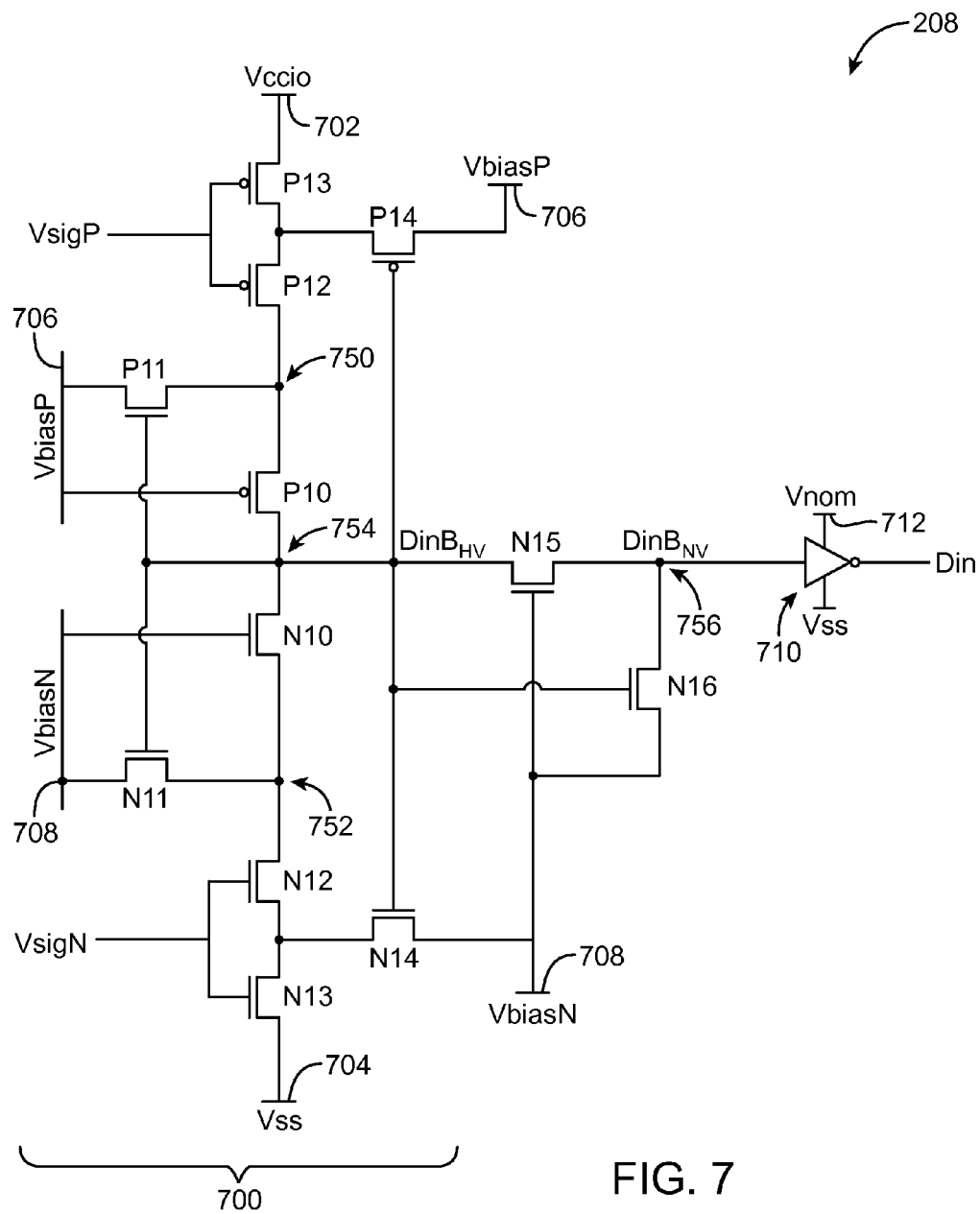
FIG. 7 is a circuit diagram of an illustrative digitization and clamping circuit of the type shown in FIG. 2 in accordance with an embodiment.

FIG. 7 is a circuit diagram of digitization and clamping circuit 208. As shown in FIG. 7, circuit 208 may include a comparator 700, an n-channel pass gate clamping transistor N15, an n-channel voltage keeper transistor N16, and an inverting circuit 710. As shown in FIG. 7, comparator 700 may be implemented as a Schmitt trigger that includes p-channel transistors P10, P12, and P13 and n-channel transistors N10, N12, and N13 coupled in series between positive power supply line 702 (e.g., a power supply line on which Vccio is provided) and ground line 704, voltage keeper switches P11 and N11, and positive feedback switches P14 and N14.

In particular, transistors P12 and P13 may have gate terminals that receive VsigP from circuits 204 and 206 (of FIGS. 2, 3, and 5), whereas transistors N12 and N13 may have gate terminals that receive VsigN from circuits 204 and 206. Transistors P12 and P13 may serve as pull-up transistors for the Schmitt trigger, whereas transistors N12 and N13 may serve as pull-down transistors for the Schmitt trigger.

Transistor P10 may have a source terminal that is coupled to an intermediate node 750 (i.e., a node that is connected to line 702 via transistors P12 and P13), a gate terminal that receives VbiasP, and a drain terminal that is coupled to a comparator output node 754 on which $DinB_{HV}$ is provided. Transistor P10 may serve as a PMOS pass gate clamp that is used to cut off current from intermediate node 750 to output node 754 when node 750 falls below (VbiasP+Vtp).

Transistor N10 may have a drain terminal that is coupled to an intermediate node 752 (i.e., a node that is connected to line 704 via transistors N12 and N13), a gate terminal that receives VbiasN, and a source terminal that is coupled to comparator output node 754. Transistor N10 may serve as a NMOS pass gate clamp that is used to cut off current from intermediate node 752 to output node 754 when node 752 rises above (VbiasN−Vtn).

Transistor P11 may have a first source-drain terminal that is coupled to intermediate node 750, a second source-drain terminal that receives VbiasP, and a gate terminal that is coupled to comparator output node 754. Transistor P11 may act like a PMOS voltage keeper that ensures that the minimum voltage at node 750 is at VbiasP while maintaining node 750 at VbiasP whenever $DinB_{HV}$ is below (VbiasP−Vtp).

Similarly, transistor N11 may have a first source-drain terminal that is coupled to intermediate node 752, a second source-drain terminal that receives VbiasN, and a gate terminal that is coupled to comparator output node 754. Transistor N11 may act like an NMOS voltage keeper that ensures that the maximum voltage at node 752 is at VbiasN while maintaining node 752 at VbiasN whenever $DinB_{HV}$ is above (VbiasN+Vtn).

Transistor P14 may have a first source-drain terminal that receives VbiasP from biasing line 706, a second source-drain terminal that is coupled to an intermediate node at which transistors P12 and P13 are connected in series, and a gate terminal that is coupled to comparator output node 754. Transistor P14 may serve as a half-latch switch that provides positive feedback for the Schmitt trigger.

Similarly, transistor N14 may have a first source-drain terminal that receives VbiasN from biasing line 708, a second source-drain terminal that is coupled to an intermediate node at which transistors N12 and N13 are connected in series, and a gate terminal that is coupled to comparator output node 754. Transistor N14 may also serve as a half-latch switch that provides positive feedback for the Schmitt trigger.

The use of transistors N14 and P14 in providing the positive feedback results in substantially high gain for Schmitt trigger translator 700 and enables the Schmitt trigger to produce sharp transition edges for $DinB_{HV}$, thereby converting VsigP and VsigN with non-negligible slew rates into a corresponding digital signal with well-defined transitions.

Transistor N15 has a gate terminal that receives VbiasN from line 708, a first source-drain terminal that receives $DinB_{HV}$, and a second source-drain terminal on which corresponding clamped signal $DinB_{NV}$ is provided (at node 756). Connected in this way, transistor N15 is cut off when $DinB_{NV}$ is above (VbiasN−Vtn), thereby clamping $DinB_{NV}$ to no more than one Vtn below Vnom (assuming VbiasN is equal to Vnom). Transistor N16 has a drain terminal that receives VbiasN from line 708, a source terminal that is coupled to node 756, and a gate terminal that is coupled to comparator output node 754. Transistor N16 may act like an NMOS voltage keeper that ensures that the maximum voltage at node 756 is at VbiasN while maintaining node 756 at VbiasN whenever $DinB_{HV}$ is above (VbiasN+Vtn).

Inverting circuit 710 that is biased using power supply line 712 and the ground line at Vnom and Vss, respectively, receives $DinB_{NV}$ that has been clamped down to one Vtn less than the nominal voltage level and produces a corresponding output Din that can now swing full rail between Vss and Vnom. The use of the Schmitt trigger to digitize the split input signals VsigP and VsigN will help remove any slew rate component from $DinB_{HV}$, which can help diminish the impact on duty cycle when the voltage of $DinB_{HV}$ is further clamped down to Vnom at $DinB_{NV}$.

Figure 8:
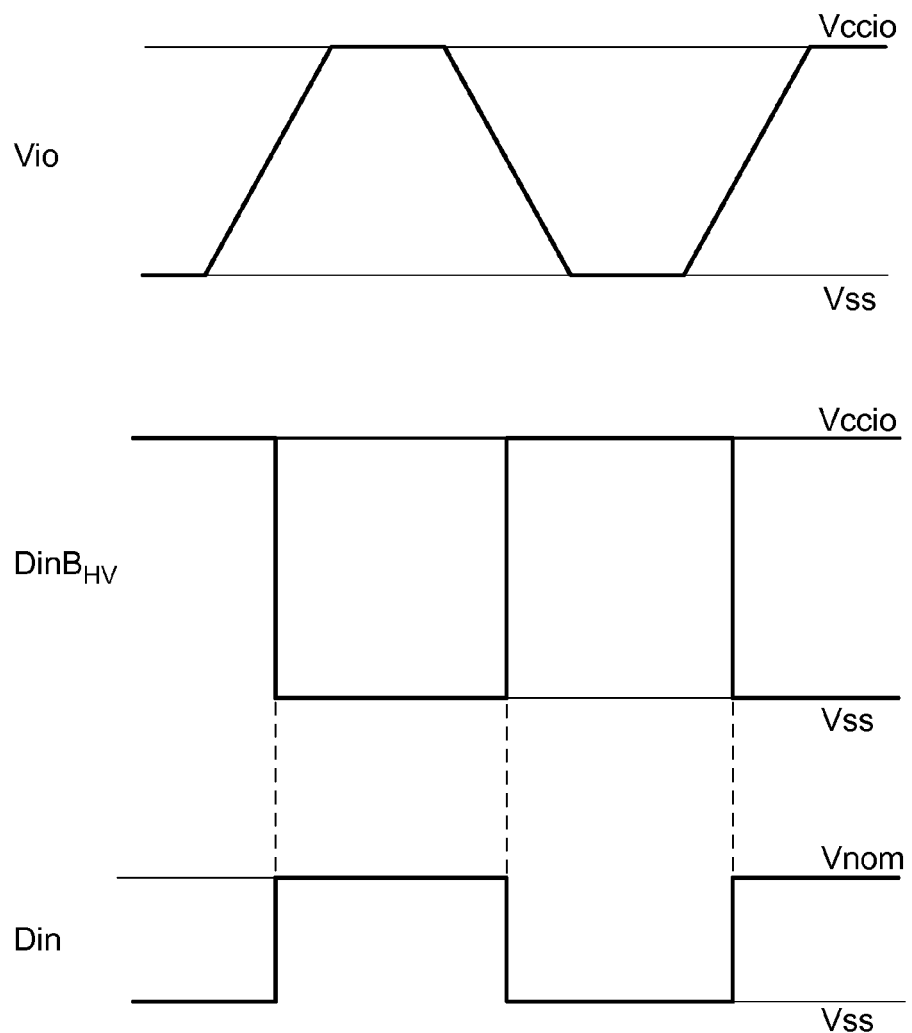
FIG. 8 show waveforms that illustrate the operation of the digitization and clamping circuit of FIG. 7 in accordance with an embodiment.

FIG. 8 is a timing diagram that illustrates the operation of circuit 208. As shown in FIG. 8, input signal Vio arriving at the IO pad can swing between Vss and Vccio with a non-negligible slew rate component. The Schmitt trigger translator portion of circuit 208 helps to digitize that signal to remove the slew rate component to output $DinB_{HV}$ that swings between Vss and Vccio. Signal $DinB_{HV}$ is then further clamped down to Vnom using clamping transistor N15 (FIG. 7) and, with the help of inverter 710, final output signal Din is able to swing full rail between Vss and Vnom.

Implementing input voltage clamping circuitry in accordance with the embodiments of FIGS. 2-8 can help overcome the duty cycle distortion and the threshold voltage offset that are associated with conventional single-pass-gate input clamps. The improved input voltage clamping circuitry described herein is able to propagate more complete signal information to the receiver for a wide range of supported voltages (e.g., for Vccio that are greater than thick gate oxide voltage Vnom or less than Vnom), to enable rail-to-rail signaling so that any input clamping becomes transparent when Vccio is within Vnom, and to help reduce duty cycle distortion and threshold voltage offset that may be present in single-ended signaling.

The examples described herein in which the input signal is split into two components VsigP and VsigN are merely illustrative and do not serve to limit the scope of the present invention. If desired, the techniques disclosed herein can be extended to cover splitting the input signal into two or more signals, at least three split signals, at least four split signals, etc. Applications where such input clamping would be use include (but are not limited to) input clamping for single-ended receivers (e.g., low voltage transistor-to-transistor logic), voltage reference receivers (e.g., stub series terminated logic), differential receivers (low voltage differential signaling logic), data holding circuits for tristate buffers, etc.

The methods and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Input voltage clamping circuitry on an integrated circuit die, comprising:
    an input that receives an input signal via an input pad; and
    a splitting circuit that splits the input signal into a first output signal having a predetermined amount of voltage swing in a first voltage range and a second output signal having the predetermined amount of voltage swing in a second voltage range that is different than the first voltage range, wherein the splitting circuit comprises:
        a p-channel pass gate clamp that is turned off in response to the first output signal falling below a first predetermined threshold.

2. The input voltage clamping circuitry defined in claim 1, wherein the splitting circuit further comprises:
    an n-channel pass gate clamp that is turned off in response to the second output signal rising above a second predetermined threshold that is different than the first predetermined threshold.

3. The input voltage clamping circuitry defined in claim 1, wherein the splitting circuit further comprises:
    a p-channel voltage keeper configured to ensure that the first output signal is maintained above a first predetermined threshold; and
    an n-channel voltage keeper configured to ensure that the second output signal is maintained below a second predetermined threshold that is different than the first predetermined threshold.

4. The input voltage clamping circuitry defined in claim 1, wherein the splitting circuit further comprises:
    a first output on which the first output signal is generated;
    a first voltage biasing line on which a first bias voltage is provided;
    a first p-channel transistor that is coupled between the input and the first output and that has a gate terminal coupled to the first voltage biasing line; and
    a second p-channel transistor that is coupled between the first voltage biasing line and the first output and that has a gate terminal coupled to the input.

5. The input voltage clamping circuitry defined in claim 4, wherein the splitting circuit further comprises:
    a second output on which the second output signal is generated;
    a second voltage biasing line on which a second bias voltage that is different than the first bias voltage is provided;
    a first n-channel transistor that is coupled between the input and the second output and that has a gate terminal coupled to the second voltage biasing line; and
    a second n-channel transistor that is coupled between the second voltage biasing line and the second output and that has a gate terminal coupled to the input.

6. The input voltage clamping circuitry defined in claim 1, wherein the splitting circuit has a first output on which the first output signal is generated and a second output on which the second output signal is generated, the circuitry further comprising:
    a transmission gate circuit that is coupled between the first and second outputs, wherein the transmission gate circuit is selectively enabled using control signals.

7. The input voltage clamping circuitry defined in claim 6, wherein the transmission gate circuit comprises pass gate clamps and voltage keepers.

8. The input voltage clamping circuitry defined in claim 1, further comprising:
    a digitizing circuit having a first input that receives the first output signal, a second input that receives the second output signal, and an output at which a corresponding digital signal is generated.

9. The input voltage clamping circuitry defined in claim 8, wherein the digitizing circuit includes a Schmitt trigger having transistors connected in a positive feedback configuration.

10. The input voltage clamping circuitry defined in claim 9, wherein the digitizing circuit further includes an n-channel pass gate clamp.

11. A method for operating input voltage clamping circuitry on an integrated circuit, comprising:
   receiving an input signal via an input pin of the integrated circuit; and
   with a voltage splitting and clamping circuit in the input voltage clamping circuitry, splitting the input signal into corresponding first and second output signals and clamping the first and second output signals so that each of the first and second output signals is limited to a predetermined amount of voltage swing, wherein the first output signal exhibits a first maximum voltage level, and wherein the second output signal exhibits a second maximum voltage level that is different than the first maximum voltage level.

12. The method defined in claim 11, wherein splitting the input signal with the voltage splitting and clamping circuit comprises generating the first and second output signals with non-overlapping voltage levels.

13. The method defined in claim 11, wherein splitting the input signal with the voltage splitting and clamping circuit comprises generating the first and second output signals with overlapping voltage levels.

14. The method defined in claim 11, further comprising:
   selectively enabling a transmission gate circuit in the input voltage clamping circuitry when the input signal has a voltage swing that is less than a predetermined threshold.

15. The method defined in claim 11, further comprising:
   with a comparator circuit in the input voltage clamping circuitry, receiving the first and second output signals from the voltage splitting and clamping circuit and outputting a corresponding digitized signal.

16. The method defined in claim 15, further comprising:
   with an n-channel pass gate in the input voltage clamping circuitry, clamping the digitized signal to a reduced voltage level.

17. An integrated circuit, comprising:
   an input pin operable to receive an input signal from external circuitry;
   input clamping circuitry that receives the input signal and that is configured to split the input signal into at least first and second parallel output signals;
   a first voltage biasing line on which a first bias voltage is provided; and
   a second voltage biasing line on which a second bias voltage is provided, wherein a first portion of the input clamping circuitry that generates the first output signal is powered using the first bias voltage, and wherein a second portion of the input clamping circuitry that generates the second output signal is powered using the second bias voltage.

18. The integrated circuit defined in claim 17, wherein the input clamping circuitry further comprises:
   a transmission gate circuit that is only enabled when the input signal has a voltage swing that is less than or equal to the second bias voltage.

19. The integrated circuit defined in claim 17, wherein the input clamping circuitry further comprises:
   a comparator that receives the first and second parallel output signals and that outputs a corresponding digitized signal; and
   a pass gate clamp for clipping the digitized signal, wherein the pass gate clamp has a gate terminal that receives the second bias voltage.

* * * * *